United States Patent
Juskey et al.

(10) Patent No.: US 6,507,102 B2
(45) Date of Patent: Jan. 14, 2003

(54) PRINTED CIRCUIT BOARD WITH INTEGRAL HEAT SINK FOR SEMICONDUCTOR PACKAGE

(75) Inventors: Frank J. Juskey, Phoenix, AZ (US); John R. McMillan, Chandler, AZ (US); Ronald P. Huemoeller, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 10/006,642

(22) Filed: Dec. 5, 2001

(65) Prior Publication Data

US 2002/0043402 A1 Apr. 18, 2002

Related U.S. Application Data

(62) Division of application No. 09/310,660, filed on May 12, 1999, now Pat. No. 6,337,228.

(51) Int. Cl.[7] .............................................. H01L 23/10
(52) U.S. Cl. ........................ 257/706; 438/121; 438/122
(58) Field of Search ...................... 29/840, 852; 156/94; 165/185; 257/668, 700, 706; 361/704, 707, 720; 438/106, 121, 122, 124

(56) References Cited

U.S. PATENT DOCUMENTS

| 5,285,352 A | 2/1994 | Pastore et al. ............... 361/707 |
| 5,365,400 A | 11/1994 | Ashiwake et al. ........... 361/752 |

(List continued on next page.)

FOREIGN PATENT DOCUMENTS

| JP | 03255690 | 11/1991 | ............ H05K/1/02 |
| JP | 05259669 | 10/1993 | ............ H05K/7/20 |

OTHER PUBLICATIONS

International Preliminary Examination Report dated Mar. 6, 2001, in International Application No. PCT/US00/13041 filed May 11, 2000.

Hundt et al., "Conduction–Cooled Ball Grid Array," SGS–Thomson Microelectronics, Inc., '95 Flip Chip, BGA, TAB & AP Symposium, 1995 Semiconductor Technology Center, Inc., pp. 100–106.

Harper, Electronic Packaging and Interconnection Handbook 2nd ed. (McGraw–Hill, New York, 1997), pp. 8.2–8.5, 8.24–8.44.

Primary Examiner—Richard Elms
Assistant Examiner—Christian D. Wilson
(74) Attorney, Agent, or Firm—Skjerven Morrill LLP

(57) ABSTRACT

A low-cost printed circuit board for a semiconductor package having the footprint of a ball grid array package has an integral heat sink, or "slug," for the mounting of one or more semiconductor chips, capable of efficiently conducting away at least five watts from the package in typical applications. It is made by forming an opening through a sheet, or substrate, of B-stage epoxy/fiberglass composite, or "prepreg," then inserting a slug of a thermally conductive material having the same size and shape as the opening into the opening. The slug-containing composite is sandwiched between two thin layers of a conductive metal, preferably copper, and the resulting sandwich is simultaneously pressed and heated between the platen of a heated press. The heat and pressure forces the resin to the surface of the composite and into the space between the slug and the walls of the composite, where it solidifies, bonding the edges of the slug to the substrate within the opening and adhering the conductive layers to the upper and lower surfaces of the substrate. The resulting laminate can thereafter be processed as a convention printed circuit board to incorporate conventional circuit board features, e.g., circuit traces, wire bonding pads, solder ball mounting lands, and via holes.

19 Claims, 2 Drawing Sheets

U.S. PATENT DOCUMENTS

| | | | |
|---|---|---|---|
| 5,455,462 A | 10/1995 | Marrs | 257/796 |
| 5,559,369 A | 9/1996 | Newman | 257/668 |
| 5,617,294 A | 4/1997 | Watson et al. | 361/719 |
| 5,642,261 A | 6/1997 | Bond et al. | 361/704 |
| 5,650,593 A | 7/1997 | McMillan et al. | 174/52.4 |
| 5,734,555 A | 3/1998 | McMahon | 361/704 |
| 5,736,785 A | 4/1998 | Chiang et al. | 257/712 |
| 5,856,911 A | 1/1999 | Riley | 361/704 |
| 5,861,670 A | 1/1999 | Akasaki | 257/7.37 |
| 5,877,552 A | 3/1999 | Chiang | 257/706 |
| 5,977,626 A | 11/1999 | Wang et al. | 257/707 |
| 6,191,360 B1 | 2/2001 | Tao et al. | 174/52.4 |

PRINTED CIRCUIT BOARD WITH INTEGRAL HEAT SINK FOR SEMICONDUCTOR PACKAGE

This is a division of U.S. application Ser. No. 09/310,660, filed May 12, 1999 now U.S. Pat. No. 6,337,228.

BACKGROUND OF THE INVENTION

1. Field of the Invention

This invention relates to semiconductor packaging in general, and in particular, to a method of producing a low-cost printed circuit board ("PCB") for a semiconductor package that has an integral heat sink capable of conducting away relatively large amounts of heat generated by components in the package during operation.

2. Description of the Related Art

The recent trend in consumer electronics has been toward smaller, lighter products having expanded functional capabilities and capacities. This trend has, in turn, resulted in a demand for packaged semiconductor devices that are smaller, yet more highly integrated and of higher capacity. Accordingly, packaging candidates for modern semiconductor devices must not only possess excellent electrical characteristics, large input/output-terminal capacities, and high heat dissipating capabilities, but must also provide these features at a competitive price if they are to remain commercially viable in this very cost-competitive environment.

One such low-cost packaging candidate is the ball grid array ("BGA") semiconductor package. BGA packages are easily formed on a conventional PCB and can effectively reduce the overall length of electronic circuits incorporating them. BGA packages also utilize power- and/or ground-bonding areas more effectively, thus yielding excellent electrical characteristics. The input/output terminal density of BGA packages is greater than that of conventional quad flat packages (QFPs), which better comports with the trend toward smaller, denser packages. And, for semiconductor chips dissipating relatively low amounts of heat during operation, BGA packages have relatively good heat dissipating characteristics.

However, the new, high-speed, high-power-dissipating chips require even higher heat dissipating capabilities in their packaging. Several methods have been proposed to enhance this capability. These typically involve mounting the chip(s), directly or indirectly, on a heat sink, or "slug," that is laminated or soldered to the top or bottom side of an interconnection substrate, such as a PCB.

For example, M. Hundt, et al. of SGS-Thomson Microelectronics, Inc., in a paper presented at the "'95Flip Chip, BAG, TAB & AP Symposium," entitled, "Conduction-Cooled Ball Grid Array," (©1995 Semiconductor Technology Center, Inc.), describe a BGA package in which a copper heat sink, or "slug," is laminated to the bottom surface, i.e., the surface on which the solder balls are mounted, of a PCB having a rectangular opening in it. A microchip is epoxied to the slug in the opening and is wire-bonded to the surrounding PCB substrate to effect electrical interconnection of the chip. The bottom surface of the heat slug is, in turn, soldered to a multilayer main board having a relatively thick ground plane. Plated-through via holes conduct heat from the bottom of the heat slug to the ground plane to convey heat away from the chip. The authors claim that this design reduces the internal thermal resistance ($\theta_{JC}$) of the package to a value typically less than 1 degree C/Watt for most sizes of chip.

A somewhat similar arrangement, in the context of a "total encasement" chip carrier package ("TE" package), is described in U.S. Pat. No. 5,650,593 to J.R. McMillan, et al. This reference describes several embodiments of a "thermally enhanced" package, one of which includes a circuit substrate with a center opening and a solder-plated metal ring attached to the bottom surface of the substrate and surrounding the opening. A heat sink is soldered to the metal ring such that a portion of it is exposed through the opening, and one or more microchips are epoxied to the exposed surface. A plastic or a metal ring also surrounds the opening on the top surface of the substrate to define a cavity, and a metal or plastic lid attaches to the ring to close off the cavity with a "gas tight" seal.

Another laminated heat slug arrangement is described in U.S. Pat. No. 5,734,555 to J. F. McMahon, in the context of a plastic pin grid array ("PPGA") semiconductor package. In this package, a microchip is electrically connected to a multilayer, intermediate PCB by inverting the chip relative to the board and contacting it to the board so that interconnection pads on the top surface of the chip engage corresponding connection pads on the bottom surface of the PCB (the so-called "flip-chip" method). The PCB has a step in it to receive the chip, and a central opening through it that exposes the top surface of the chip through the board. A copper heat slug with a rabbeted face is attached to the top surface of the board, with the rabbeted face disposed in the opening above the chip and bonded to it with a layer of thermally conductive epoxy. The heat slug may also be attached to a finned heat sink on the top of the package for enhanced convective-air cooling.

Yet another laminated heat sink arrangement in the context of a plastic molded package having a lead frame is described in U.S. Pat. No. 5,455,462 to R.C. Marrs. The heat sink in this reference features a circumferential "locking ring" that engages and keys with the plastic encapsulating the package to provide a better seal between the encapsulant and the heat sink.

A somewhat more radical approach to cooling of very high heat dissipating microchips is described in U.S. Pat. No. 5,365,400 to T. N. Ashiwake, et al. Here, one or more bare semiconductor chips are mounted to a ceramic main board using the flip-chip method, and a heat sink is soldered directly to the top surface of each of the bare chips. The heat sinks, which are individually supplied with a forced cooling fluid, e.g., fluorocarbon, may be connected to a plenum, or header, by means of an extensible bellows.

While each of the foregoing solutions addresses the problem of enhanced microchip cooling to a greater or lesser extent, they do not address the problem of achieving this result in a simple, low-cost packaging arrangement. In particular, it may be seen that, in those references that utilize a conventional PCB to interconnect the microchip, one or more manual, and in some cases, relatively complex, post-PCB-lamination fabrication and/or assembly steps are required to implement an integral heat sink into the package. These additional steps necessarily result in additional costs to the package, which detracts somewhat from their desirability for use in a consumer electronics commercial environment.

What is needed, then, is a lower-cost, easier-to-produce semiconductor packaging arrangement that achieves enhanced chip cooling without the need for any post-lamination procedures to implement a heat sink. Indeed, what is needed is a package that meets a "5-watts-for-less-than-$5" goal.

BRIEF SUMMARY OF THE INVENTION

This invention provides a method for producing a low-cost PCB for a semiconductor package, e.g., a BGA semiconductor package, that incorporates a heat sink without the need for additional post-lamination assembly procedures, one that is capable of meeting the above, "5-watts-for-less-than-$5" goal. The novel PCB has an integral heat sink for the mounting of one or more semiconductor chips thereon, and in most applications, is capable of effectively conducting a relatively large amount of heat away from the package, an amount that is well in excess of that conveyed by conventional semiconductor package PCBs.

The method comprises punching an opening of a given size and shape through the thickness of a glass reinforcement that has been impregnated with a B-stage epoxy resin. A heat slug of a thermally conductive metal having about the same size and shape as the opening is inserted into the opening, and the slug containing substrate is then sandwiched between two sheets of an electrically conductive metal, e.g., copper foil. The sandwich is placed in a heated press, which applies heat and pressure to the two opposite faces of the sandwich, forcing the resin to melt and flow into the spaces in the opening between the opposing sidewalls of the slug and the substrate, where it solidifies, thereby simultaneously bonding the slug to the substrate within the opening, and adhering the conductive layers to the upper and lower surfaces of the substrate, with the heat slug sandwiched therebetween.

Subsequent processing of the PCB is the same as with conventional PCBs, and may comprise removing, e.g., by etching away, of portions of the conductive layers overlying the slug on opposite sides of the substrate to expose a semiconductor die-bonding pad directly atop the slug, as well as an area for thermally bonding the slug, e.g., with solder or a filled epoxy, to a main board on the bottom of the slug.

A better understanding of these and other features and advantages of the method may be obtained from a consideration of the detailed description of the invention below, particularly if that description is considered in conjunction with the accompanying drawings. Following is a brief description of the several views of those drawings.

DETAILED DESCRIPTION OF THE INVENTION

Figure 1:
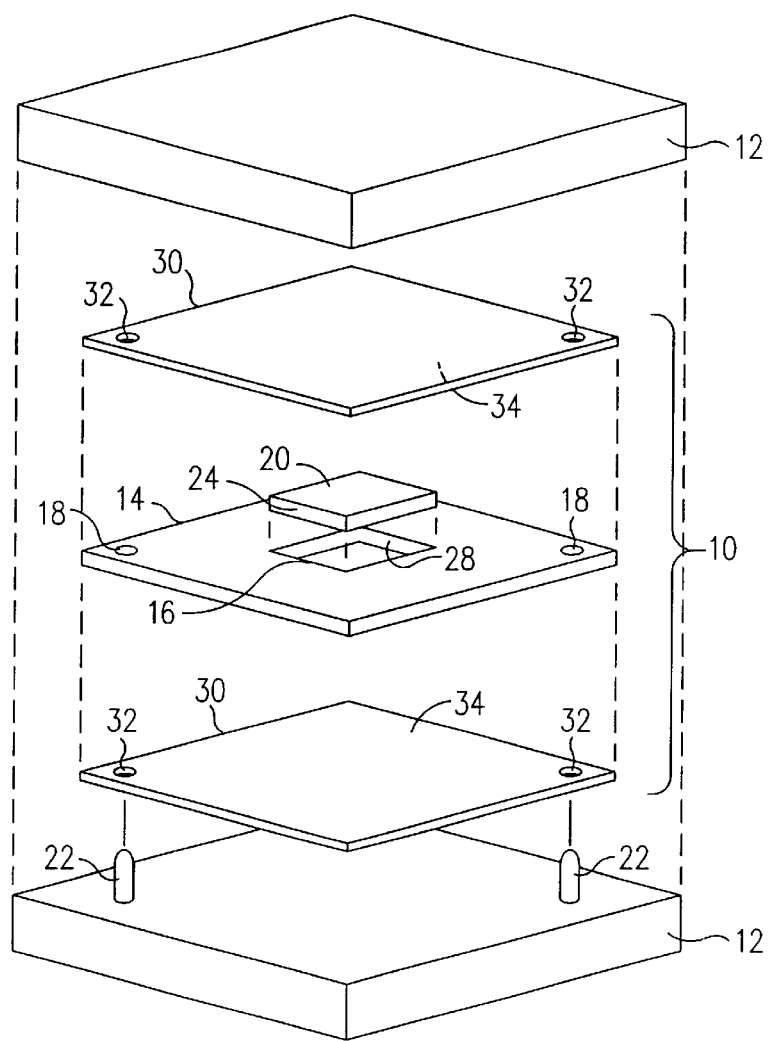
FIG. 1 is an exploded view of a PCB having an integral heat sink for use in a semiconductor package and made in accordance with the method of the present invention, shown positioned between the platen of a heated press.
Figure 2:
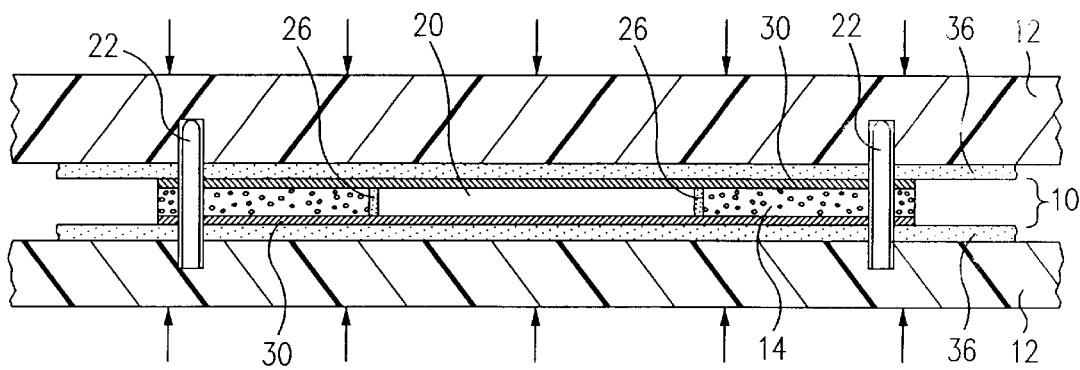
FIG. 2 is an elevational view of the assembled PCB as seen in FIG. 1, shown compressed between the platen of the press.

As shown schematically in FIGS. 1 and 2, the method of the invention comprises forming an assembly, or "lay-up" 10, of the constituent laminar elements of the PCB, then pressing them together between the platen 12 of a heated press to laminate the elements together in flat, thin, relatively rigid sandwich.

In preparation for forming the lay-up 10, a substrate 14 of a porous, dielectric material, e.g., fiberglass, is impregnated with a thermosetting epoxy resin to form a matrix, or "B-staged" composite, of the two materials. In the industry, epoxy resin is often characterized, in reference to its state of cure, as being "A-stage," "B-stage" or "C-stage" resin. "A-stage" refers to resin that is in a relatively uncured, liquid state, typically dissolved in a solvent; "B-stage" refers to resin that is partially cured to a relatively soft, malleable solid, with the solvent removed; and, "C-stage" resin refers to resin that is fully cured into a hard, rigid solid.

The desired composite 14 can be made by dipping or otherwise soaking a "dry" sheet of the dielectric material with a coating of A-stage resin, draining or "squeegeeing" off the excess resin, then flash-drying or otherwise removing the solvent, and partially curing the resin remaining in the soaked sheet, e.g., by the application of heat, or irradiation with ultraviolet light, into the B-stage condition. Alternatively, a variety of composites of porous substrates impregnated with B-stage the thermosetting resins, referred to in the industry as "pre-pregs," are available commercially from a number of vendors for use in ordinary PCB fabrication. Pre-pregs used for the fabrication of semiconductor package PCBs typically have a thickness ranging from about 4 to about 60 mils.

In a preferred embodiment of the invention, the dielectric, or insulative, material of the substrate 14 is fiberglass. However, depending on the application at hand, other porous substrate materials, e.g., sheets of interwoven Kevlar, carbon fiber, or Teflon-coated polymer fibers can also be used to particular effects. The preferred thermosetting resins are polyimide resin, epichloridehydrin bisphenol-A resin (epoxy), or bismaleimidetriazine ("BT") resin, although other heat-curing resins may also be used advantageously, depending on the properties desired in the finished PCB 10. Also, additional resins may be included in the basic resin to impart special electrical or mechanical properties. Examples of such "additives" include polyphenylene oxide ("PPO"), polyphenylene stearate ("PPS"), and poly-ether imide.

Preparation of the substrate 14 for the lay-up further comprises forming a central window, or opening 16, of a particular size and shape, through the thickness of the substrate, as well as one or more tooling holes 18. The opening 16 comprises the situs of an integral heat sink 20 of the PCB 10, as well as region on which one or more semiconductor dies 64 (not seen in FIGS. 1 or 2) will be mounted in the finished package, and for this reason, is generally square or rectangular in shape. The tooling holes 18 may be round, oval, or square, and are for the receipt of tooling pins 22 mounted in the platen 12, and are used to align and hold the elements of the PCB relative to each other in the press during the lay-up and curing steps, and also for proper orientation of the layers, if a sequential lamination process is used. Both the central heat sink opening 16 and the tooling holes 18 can be formed easily and accurately by punching or die-cutting the soft material of the pre-preg.

The heat sink, or "slug," 20 is simply a slab, or "coupon," of material that is an efficient conductor of heat, and is sized and shaped to fit closely within the central opening 16 in the composite substrate 14. The heat slug has a thickness that is about the same as, or slightly less than, that of the substrate and generally vertical sidewalls 24 around its periphery. Preferably, the periphery of the heat slug 20 is slightly smaller than that of the opening 16, so that when the heat slug is disposed in the opening, there is a slight gap, or space 26 (see FIG. 2), typically in the range of about one to two mils (.001"–.002"), between the sidewalls 24 of the heat slug and the opposing sidewalls 28 of the substrate 14 inside of the opening.

While the size of the space 26 between the heat sink 20 and the substrate 14 is not critical, it is desirable that it not be too large in that, as described in more detail below, during the pressing operation, molten resin is squeezed out of the substrate and into the space, where it solidifies to bond the opposing sidewalls of the heat sink and the substrate to each other. If the gap is too large, it is possible that the resin will not entirely fill the gap, resulting in the presence of voids in the epoxy, and hence, a structurally weak bond. On the other hand, if the heat sink 20 is too large, some undesirable deformation of the substrate could occur when the relatively harder slug is inserted into the opening 16 in the relatively softer substrate. It has been discovered that a space of from about 1–2 mils clearance is adequate for most applications.

Preferably, the heat slug 20 is made of pure, soft copper, the surface of which has been chemically oxidized to make it easier to bond to, as copper provides a fairly good tradeoff between good thermal conductivity, good bondability (whether to epoxy or solder), and a lower cost. Obviously, such precious metals as silver or gold could provide greater thermal conductivity relative to copper, but their costs mandate against their use in a low-cost, thermally enhanced PCB, the goal of the present invention. Other low-cost heat sink materials that have been found to have some benefits in the context of this invention are aluminum alloys and a beryllium-copper alloy.

The lay-up 10 additionally comprises two thin, identical face sheets, or layers 30, of an electrically conductive metal. The preferred material for these two elements is "5 nines pure" copper foil, i.e. 99.999% pure copper. Such material is commercially available in sheets of various thicknesses. For the typical semiconductor package PCBs of the type contemplated in this invention, the copper foil layers 30 will have a thickness of about 18 microns (≈0.7 mils).

As in the case of the heat slug 20, another material that has shown some promise for use as the electrically conductive layers is aluminum, because of its low cost and relatively high electrical and thermal conductivities. However, unlike copper, aluminum is somewhat difficult both to plate with other metals, and/or to solder or wire bond to directly, because of its tendency to oxidize rapidly in ordinary ambient conditions. The main drawback of aluminum, however, is that it has both a higher coefficient of thermal expansion and lower structural integrity than many other materials, including silicon. Therefore, extra care must be taken in the design of PCBs incorporating aluminum and alloys thereof to avoid cracking and/or warping problems over wide temperature ranges. Consequently, while aluminum exhibits good functional properties, and the initial cost of the material is relatively low, the above drawbacks detract somewhat from its preference in this particular application.

The electrically conductive foil layers 30 are, like the copper heat sink 20 and the composite substrate 14, relatively easy to fabricate by means of die cutting, and it is preferable they each be further punched or drilled to include one or more tooling holes 32, which serve the same function as the tooling holes 18 in the substrate, viz., positioning and alignment of the parts in the lay-up. As an additional preparatory step, it is desirable to chemically treat at least one side, viz., the side facing toward the substrate 14 in the lay-up, of each of the layers 30, to create an oxide layer thereon. The oxide layer provides additional mechanical "tooth" for the epoxy to adhere to, and thus enhances the strength of the bond between the respective electrically conductive layers 30 and the substrate 14.

When the constituent elements of the PCB 10 are prepared, their lay-up can commence. Typically the laminar elements are sandwiched between two layers of Kraft paper 36 (see FIG. 2), which serve as soft "buffers" between the PCB lay-up and the relatively harder platen 12 of the press, to prevent excess resin extruded from the compressed PCB from adhering to the face of the platen, and to diffuse the heat from the platen, making it more uniform across the platen. In this regard, it may be desirable to further sandwich the lay-up between two optional, stainless steel plates (not illustrated), called a "cull plates," that further serve to diffuse the heat from the platen 12 and protect their surfaces from being coated with excess resin.

The stack of the PCB lay-up 10 on the bottom platen 12 of the press then comprises, from bottom to top, an optional bottom cull plate, a bottom layer of Kraft paper 36, a bottom layer 30 of electrically conductive foil, the pre-preg composite 14, with the integral heat slug 20 disposed within the central opening 16, a top layer 30 of electrically conductive foil, a top layer of Kraft paper 36, and an optional top cull plate. The tooling pins 22 in the platen extend through the openings 18 and 32 in the conductive layers 30 and substrate 14, respectively, to position and align the laminations relative to each other, whereas the central opening 16 serves to appropriately position and align the heat slug 20 within the sandwich.

The foregoing description has been with reference to the lay-up of a single PCB 10. However, those skilled in the art will recognize that substantial economies of production can be achieved by laying-up and pressing a number of PCBs simultaneously. These multiple, or "ganged," lay-ups can be made in either strip form or sheet form such that a large number of adjacent, connected PCBs 10 are laminated at the same time. Indeed, fabrication of these strips or sheets of multiple PCBs can be continued right through the etch, solder masking, chip attachment, wire bonding and chip encapsulation steps, until such point in the process as it becomes desirable to separate, or "singularize," the individual packages from the ganged sheets or strips in a cutting operation.

Moreover, multiple layers can be stacked in the press, one on top of the other, with interleaving layers of Kraft paper and/or cull plates, like pages in a book, to achieve even greater production volume in a single pressing.

During the lamination process, the platen 12 of the press apply pressure to the top and bottom surfaces of the lay-up 10, causing resin to be expressed from the substrate 14 into the space 26 between the respective, opposed vertical sidewalls 24, 28 of the heat sink 20 and the substrate 14, as well as to the top and bottom surfaces of the substrate, where it contacts the respective facing surfaces of the conductive layers 30. Heat is simultaneously applied to the lay-up 10 by the platen, which causes the molten resin to melt, flow, and then solidify, thereby bonding the heat sink 20 to the substrate within the opening 16, and adhering the conductive layers 30 to the opposite faces of the substrate 14. After the resin is cured, the rigid, laminated PCB 10 can be removed from the press and passed on to the next stages of the fabrication operation, which are fairly conventional in nature.

Figure 3:
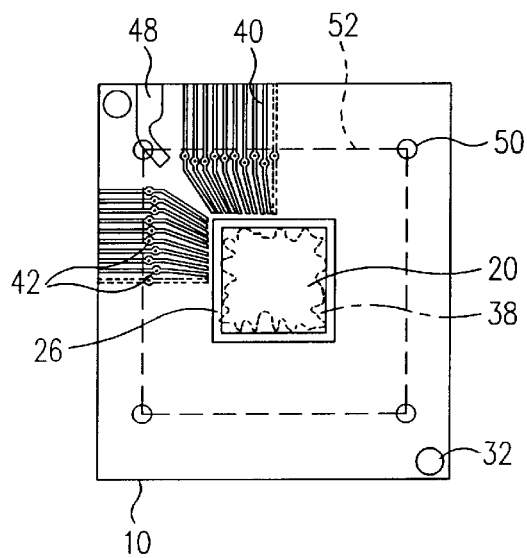
FIGS. 3 and 4 are top and bottom plan views, respectively, of the PCB shown in FIG. 1; and, FIG. 5 is an enlarged cross-sectional view in elevation of a BGA package incorporating the PCB of the present invention.
Figure 4:
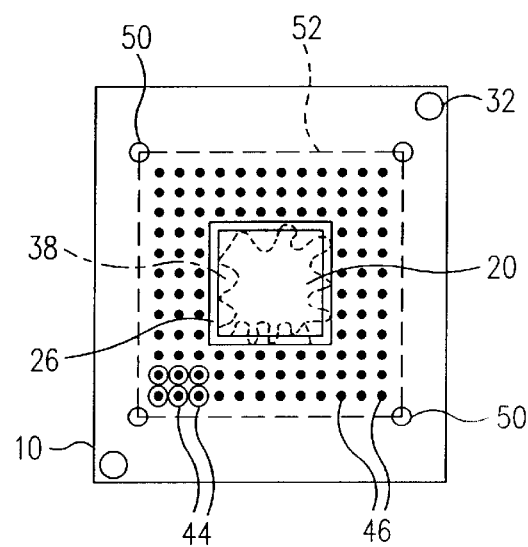

With reference to FIGS. 3 and 4, it may be seen that, after lamination, each of the opposite surfaces of the heat slug 20 will be overlain by one of the electrically conductive layers 30, and will be separated from its respective, overlying layer 30 by a thin layer of air and/or excess resin "flash" 38 (shown by phantom lines in FIGS. 3 and 4), which may be expressed into the space between the two components during the lamination process. Since these elements add undesirable thermal resistance between a component mounted atop the heat slug 20 and a surface to which the heat slug is mounted, it is preferable that they be removed to ex-pose a bare surface on the top and bottom of the heat slug. The regions of the electrically conductive layers 30 overlying the respective opposite surfaces of the heat slug 20 are preferably etched away during the same etch process used to define, e.g., circuit traces 40 and wire bond pads 42 in the conductive layer 30 on the top surface of the substrate 14, and solder ball pads 44 in the conductive layer 30 on the bottom surface of the substrate 14, using conventional photo-lithography techniques. Any underlying excess resin flash 38 can be removed in a separate etch with, e.g., a hot, concentrated solution of potassium permanganate.

In addition to the above, it may be desirable to add other features to the PCB 10 prior to the assembly of the semiconductor package. These may include, for example, plated-through "via" holes 46 to convey signals and power between the conductive circuit traces 40 and/or wire bond pads 42 on the top surface of the PCB and the solder ball lands 44 on the bottom surface of the board. A mold runner gate 48 can be added to aid in the removal of an excess resin sprue after the injection of a protective encapsulant of resin around the electrical components during package molding. Additional tooling holes 50 through the board can be punched or drilled to define cutting lines 52 (shown dotted in FIGS. 3 and 4) along which the PCB 10 is cut, as described above, to singularize the individual packages from a multi-unit "gang" board. A solder mask 54 (see FIG. 5) can be printed over the conductive layers 30 to prevent solder from attaching to them except at selected openings formed through the mask.

Figure 5:
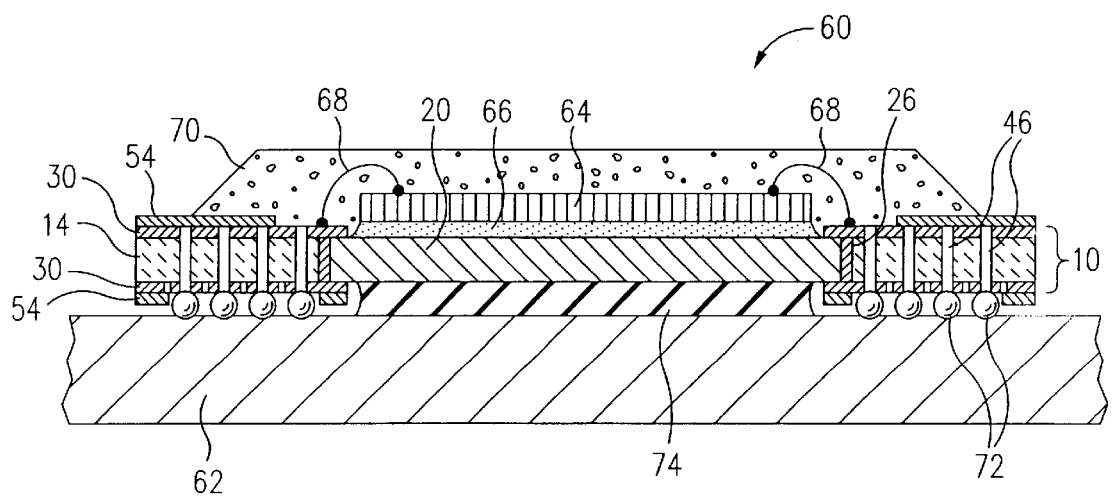

A BGA semiconductor package 60 incorporating the novel PCB 10 of the present invention is illustrated in cross-section in FIG. 5, shown solder-mounted to a main, or "mother," board 62. A microchip 64 is bonded to the surface of the heat sink 20 by a layer 66 of thermally conductive epoxy, e.g., a silver-filled epoxy. A plurality of fine wires 68, e.g., gold wires, interconnect wire bonding pads (not seen in FIG. 5) on the top surface of the chip 64 to the wire bond pads 42 on the upper surface of the PCB 10. After the chip is wire bonded to the PCB, the semiconductor chip 64 and the fine bonding wires 68 are encapsulated with a protective resin envelope 70 to seal them against moisture and protect them against shock and vibration.

In a BGA package, the electrical input/output terminals comprise a plurality of solder balls 72, which attach at respective ones of the solder ball mounting lands, or pads 44 on the bottom surface of the PCB 10. An efficient thermal path can be defined between the chip 64 and the main board 62 by bonding the bottom surface of the heat slug 20 to the main board with a thermally conductive epoxy, or more preferably, by soldering it to a plated area on the main board using, for example, a solder paste or preform 74 which is re-flowed at the same time the solder ball 72 interconnections are made to the main board 62.

By now, those skilled in the art will recognize that various modifications can be made in the method of the present invention, depending on the particular problem to be addressed. For example, it is possible to fabricate a multilayer PCB having an integral heat sink by starting with a pre-etched core PCB and adding layers and a heat sink to it in the last lay-up in a manner similar to that described above. Similarly, if the area of the heat slug is reduced to less than that of the microchip, the microchip can be inverted and mounted to the heat sink using the "flip-chip" method described above, wherein connection pads on the margins of the chip overhang the heat sink and contact pads directly on the PCB without the use of wirebonds. This enables a low-profile package to be assembled, one that can be mounted to a main board with the exposed surface of the heat sink facing upwards for contact with, e.g., a heat-conducting spring clip, a finned, convective cooler, or a thermoelectric cooler.

Accordingly, the particular embodiments of the invention described and illustrated herein should be understood as being exemplary in nature, and not as definitional of the scope of the present invention, which is limited only by that of the claims appended hereafter.

What is claimed is:

1. A printed circuit board, comprising:
   a dielectric sheet having opposed planar and parallel top and bottom surfaces, and an opening therethrough, the opening having a periphery and interior side walls that are perpendicular to the top and bottom surfaces of the sheet;
   a heat sink having opposed continuously planar and parallel top and bottom surfaces, a periphery, and exterior sidewalls that are perpendicular to the top and bottom surfaces of the heat sink, the heat sink being disposed in the opening of the dielectric sheet such that the respective top and bottom surfaces of the heat sink and the dielectric sheet are generally coplanar, and the exterior sidewalls of the heat sink and the interior sidewalls of the dielectric sheet are in spaced opposition to each other; and,
   an adhesive attaching the opposing interior and exterior sidewalls of the dielectric sheet and the heat sink, respectively, to each other.

2. The printed circuit board of claim 1, further comprising a layer of an electrically conductive material attached to at least one of the top and bottom surfaces of the dielectric sheet with the adhesive.

3. The printed circuit board of claim 2, wherein the electrically conductive layer comprises at least one of a circuit trace and a land.

4. The printed circuit board of claim 2, wherein at least a portion of the heat sink is exposed through the conductive layer.

5. The printed circuit board of claim 2, wherein at least one of the electrically conductive layer and the heat sink comprises copper.

6. The printed circuit board of claim 1, wherein the dielectric sheet has an electrically conductive via between the top and bottom surfaces thereof.

7. The printed circuit board of claim 2, wherein the dielectric sheet comprises a composite of a fibrous dielectric material impregnated with the adhesive.

8. A semiconductor package, comprising:
   a printed circuit board comprising
      a dielectric sheet having opposed planar and parallel first and second surfaces, and an opening therethrough, the opening having a periphery and interior side walls that are perpendicular to the first and second surfaces of the sheet,
      a heat sink having opposed continuously planar and parallel first and second surfaces, a periphery, and exterior sidewalls that are perpendicular to the first and second surfaces of the heat sink, the heat sink being disposed in the opening of the dielectric sheet such that the respective first and second surfaces of the heat sink and the dielectric sheet are generally coplanar, and the exterior sidewalls of the heat sink and the interior sidewalls of the dielectric sheet are in spaced opposition to each other, and, an adhesive attaching the opposing interior and exterior sidewalls of the dielectric sheet and the heat sink, respectively, to each other; and a semiconductor die thermally coupled to the first surface of the heat sink and electrically coupled to the printed circuit board.

9. The semiconductor package of claim 8, wherein the printed circuit board further comprises a patterned first metal layer laminated to the first surface of the dielectric sheet and the heat sink with the adhesive.

10. The semiconductor package of claim 9, wherein a portion of the first surface of the heat sink thermally coupled to the semiconductor die is exposed through the first metal layer.

11. The semiconductor package of claim 9, wherein the printed circuit board further comprises a second metal layer laminated to the second surfaces of the dielectric sheet and the heat sink with the adhesive, said patterned first and second metal layers being electrically coupled through the dielectric sheet.

12. The semiconductor package of claim 11, wherein a portion of the second surface of the heat sink is exposed through the second metal layer.

13. The semiconductor package of claim 9, wherein the dielectric sheet comprises a composite of a fibrous dielectric material impregnated with the adhesive.

14. The semiconductor package of claim 8, wherein the printed circuit board further comprises patterned first and second metal layers respectively laminated to the first and second surfaces of the substrate sheet with the adhesive and electrically coupled through the dielectric sheet.

15. The semiconductor package of claim 14, wherein the dielectric sheet comprises a composite of a fibrous dielectric material impregnated with the adhesive.

16. A semiconductor package comprising:

an insulative substrate having opposed first and second surfaces and an aperture between the first and second surfaces;

a cylindrical metal slug within said aperture and extending between the first and second surfaces of the substrate, said metal slug adhered only to inner walls of the aperture;

a plurality of metal circuit patterns at least on one of the first and second surfaces of the substrate and attached thereto with an adhesive; and a semiconductor die electrically coupled to the circuit patterns and thermally coupled to the metal slug.

17. The semiconductor package of claim 16, wherein the metal slug has planar first and second surfaces that are generally coplanar with the first and second surfaces of the substrate, respectively.

18. The semiconductor package of claim 17, wherein outer cylindrical walls of the metal slug are adhered to the inner walls of the aperture by the adhesive, said adhesive originating in and impregnating the substrate.

19. The semiconductor package of claim 17, wherein the metal circuit patterns are on both the first and second surfaces of the substrate, and are electrically coupled through the substrate.

* * * * *